United States Patent
Johnson et al.

(10) Patent No.: US 11,822,253 B2
(45) Date of Patent: Nov. 21, 2023

(54) DECREASING DISTORTION BY MODIFYING PIXEL SPACING

(71) Applicant: Applied Materials, Inc., Santa Clara, CA (US)

(72) Inventors: Joseph Johnson, Redwood City, CA (US); Christopher Bencher, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/740,960

(22) Filed: May 10, 2022

(65) Prior Publication Data

US 2022/0357665 A1 Nov. 10, 2022

Related U.S. Application Data

(60) Provisional application No. 63/186,794, filed on May 10, 2021.

(51) Int. Cl.
*G03F 7/20* (2006.01)
*G03F 7/00* (2006.01)

(52) U.S. Cl.
CPC .................. *G03F 7/7055* (2013.01)

(58) Field of Classification Search
CPC ............... G03F 7/7055; G03F 7/70275; G03F 7/70508; G03F 7/70516; G03F 7/70291; G03F 7/70633; G03F 7/0035; G03F 7/0002; G03F 9/7007; G03F 9/7042; H01L 21/0274; B05D 3/12; B05D 3/06
See application file for complete search history.

(56) References Cited

U.S. PATENT DOCUMENTS

| | | |
|---|---|---|
| 8,390,786 B2 | 3/2013 | Laidig |
| 10,416,550 B2 | 9/2019 | Johnson et al. |
| 2015/0346608 A1* | 12/2015 | Seidel ...................... G03F 1/84 355/52 |
| 2020/0301288 A1 | 9/2020 | Johnson et al. |

* cited by examiner

*Primary Examiner* — Mesfin T Asfaw
(74) *Attorney, Agent, or Firm* — Servilla Whitney LLC

(57) ABSTRACT

Methods, systems and apparatus for decreasing total distortion of a maskless lithography process are disclosed. Some embodiments provide methods, systems and apparatus for decreasing total distortion without physical modification of the apparatus.

20 Claims, 9 Drawing Sheets

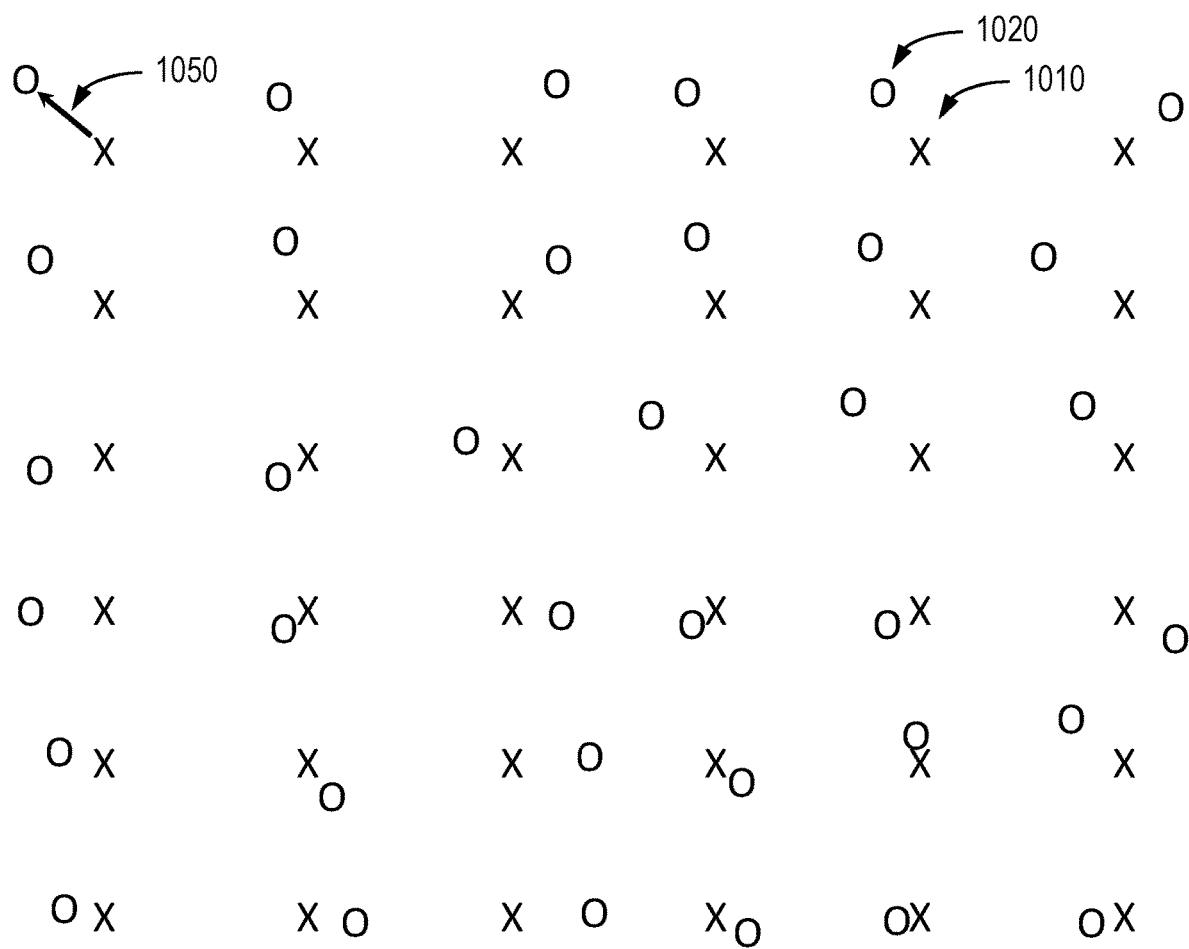
FIG. 9
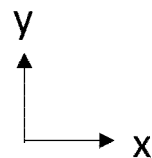

DECREASING DISTORTION BY MODIFYING PIXEL SPACING

CROSS-REFERENCE TO RELATED APPLICATIONS

This application claims priority to U.S. Provisional Application No. 63/186,794, filed May 10, 2021, the entire disclosures of which are hereby incorporated by reference herein.

TECHNICAL FIELD

Embodiments of the disclosure generally relate to apparatuses, systems, and methods for processing one or more substrates, and more specifically to apparatuses, systems, and methods for performing photolithography processes. In particular, embodiments of the disclosure relate to improved apparatuses, systems and methods for decreasing distortion of patterns on substrates during processing.

BACKGROUND

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated.

Microlithography techniques have been employed to create electrical features incorporated as part of the liquid crystal material layer forming the pixels. According to these techniques, a light-sensitive photoresist is applied to at least a portion of the substrate. Then, a pattern generator exposes selected areas of the light-sensitive photoresist with light to cause chemical changes to the photoresist in the selected areas to prepare these areas for subsequent material removal and/or material addition processes to create the electrical features.

One lithography technique useful for exposing light-sensitive photoresists is spatial light modulation. These techniques can be performed with a digital micromirror device (DMD). A DMD typically scans a substrate and transfers the pattern to the substrate through a series of digitized point exposures. The cumulative effect of these exposures provides the final pattern.

Yet, DMD techniques can be highly sensitive to native optical distortions, even at the nanometer level. These distortions can cause mura effects that cause pattern lines to appear uneven or banded.

Accordingly, there is a need for modified DMD apparatuses and methods to precisely and cost-effectively create patterns on substrates, such as large area substrates, with less distortion.

SUMMARY

One or more embodiments of the disclosure are directed to a method for minimizing distortion. The method comprises projecting a first exposure pattern with a first pitch and a first rotation. A first distortion of the first exposure pattern is determined. A modified pitch or a modified rotation is applied to the first exposure pattern to simulate a modified exposure pattern. The modified pitch being different than the first pitch by an amount or the modified rotation being different than the first rotation by an angle. A modified distortion of the modified exposure pattern is determined. Application of a modified pitch which is altered by the amount or a modified rotation which is altered by the angle is applied to simulate modified exposure patterns and determine the modified distortion until the modified pitch equals a predetermined final pitch or the modified rotation equals a predetermined final rotation. The distortion of each exposure pattern is compared to determine the exposure pattern and corresponding pitch or rotation with the minimum distortion.

Additional embodiments of the disclosure are directed to a computer system for decreasing optical distortion. The computer system comprises a processor and a memory storing instructions that, when executed by the processor, cause the computer system to: project a first exposure pattern with a first pitch and a first rotation; determine a first distortion of the first exposure pattern; apply a modified pitch or a modified rotation to the first exposure pattern to simulate a modified exposure pattern, the modified pitch being different than the first pitch by an amount or the modified rotation being different than the first rotation by an angle; determining a modified distortion of the modified exposure pattern; repeat application of a modified pitch which is altered by the amount or a modified rotation which is altered by the angle to simulate modified exposure patterns and determining the modified distortion until the modified pitch equals a predetermined final pitch or the modified rotation equals a predetermined final rotation; and compare the distortion of each exposure pattern to determine the exposure pattern and corresponding pitch or rotation with the minimum distortion.

Further embodiments of the disclosure are directed to a non-transitory computer readable medium storing instructions that, when executed by a processor, cause a computer system to decrease total distortion, by projecting a first exposure pattern with a first pitch and a first rotation. A first distortion of the first exposure pattern is determined. A modified pitch or a modified rotation is applied to the first exposure pattern to simulate a modified exposure pattern, the modified pitch being different than the first pitch by an amount or the modified rotation being different than the first rotation by an angle. A modified distortion of the modified exposure pattern is determined. Application of a modified pitch which is altered by the amount or a modified rotation which is altered by the angle is repeated to simulate modified exposure patterns and determine the modified distortion until the modified pitch equals a predetermined final pitch or the modified rotation equals a predetermined final rotation. The distortion of each exposure pattern is compared to determine the exposure pattern and corresponding pitch or rotation with the minimum distortion.

BRIEF DESCRIPTION OF THE DRAWINGS

So that the above recited features of the present disclosure can be understood in detail, a more particular description of the disclosure, briefly summarized above, may be had by reference to certain embodiments, some of which are illustrated in the appended drawings. It is to be noted that the appended drawings illustrate only some typical embodiments of this disclosure and are therefore not to be considered limiting of its scope. The disclosure may admit to equally effective embodiments which are not illustrated in the appended drawings.

FIG. 9 illustrates an exemplary exposure pattern as compared to an expected exposure pattern according to one embodiment.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure generally provide improved photolithography systems and methods for decreasing total distortion.

A DMD comprises rows and columns of micromirrors disposed opposite a substrate. Light beams reflect off the micromirrors onto the substrate, resulting in a patterned substrate.

Figure 1:
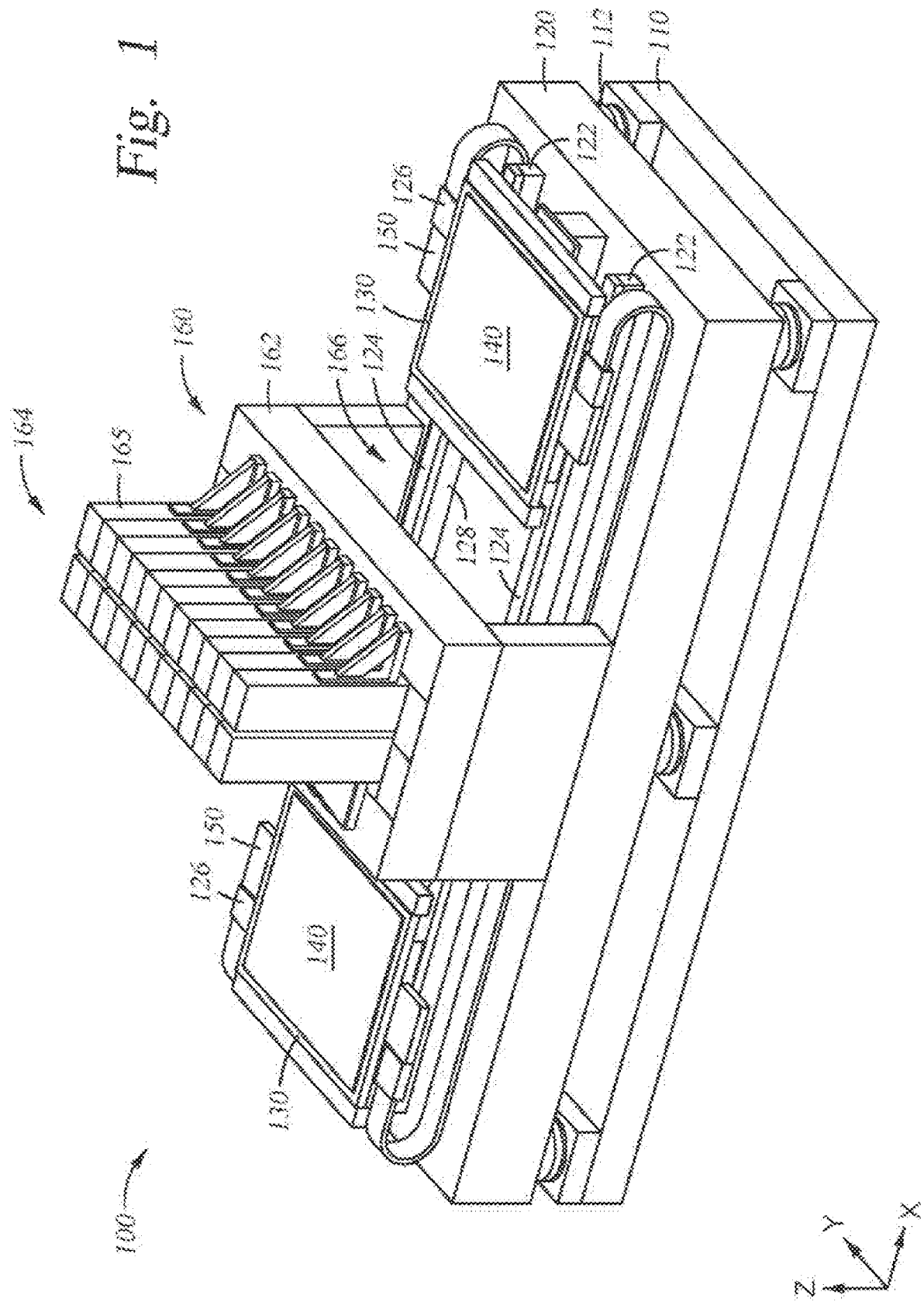
FIG. 1 is a perspective view of a system that may benefit from embodiments disclosed herein.

FIG. 1 is a perspective view of a photolithography system 100. The system 100 includes a base frame 110, a slab 120, a stage 130, and a processing apparatus 160. The base frame 110 rests on the floor of a fabrication facility and supports the slab 120. Passive aft isolators 112 are positioned between the base frame 110 and the slab 120. In some embodiments, the dab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

In some embodiments, the substrate 140 has a photoresist layer formed thereon. A photoresist is sensitive to light radiation. A positive photoresist, when exposed to radiation, will be respectively soluble to a photoresist developer applied to the photoresist after the pattern is "written" into the photoresist. A negative photoresist will be respectively insoluble to a photoresist developer. The chemical composition of the photoresist determines whether the photoresist will be a positive photoresist or a negative photoresist. Examples of photoresists include, but are not limited to, at least one of diazonaphthoquinone, a phenol formaldehyde resin, poly(methyl methacrylate), poly(methyl glutarimide), and SU-8. In this manner, the pattern is created on a surface of the substrate 140 to form the electronic circuitry.

The system 100 includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the stage 130 moves along the tracks 124 in the X-direction. In some embodiments, the pair of tracks 124 is a pair of parallel magnetic channels. As shown, each track of the pair of tracks 124 is linear. In other embodiments, one or more track is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In some embodiments, the processing unit 164 is a pattern generator configured to expose a photoresist on the substrate 140 to a photolithography process. In some embodiments, the pattern generator is configured to perform a maskless lithography process.

Figure 2:
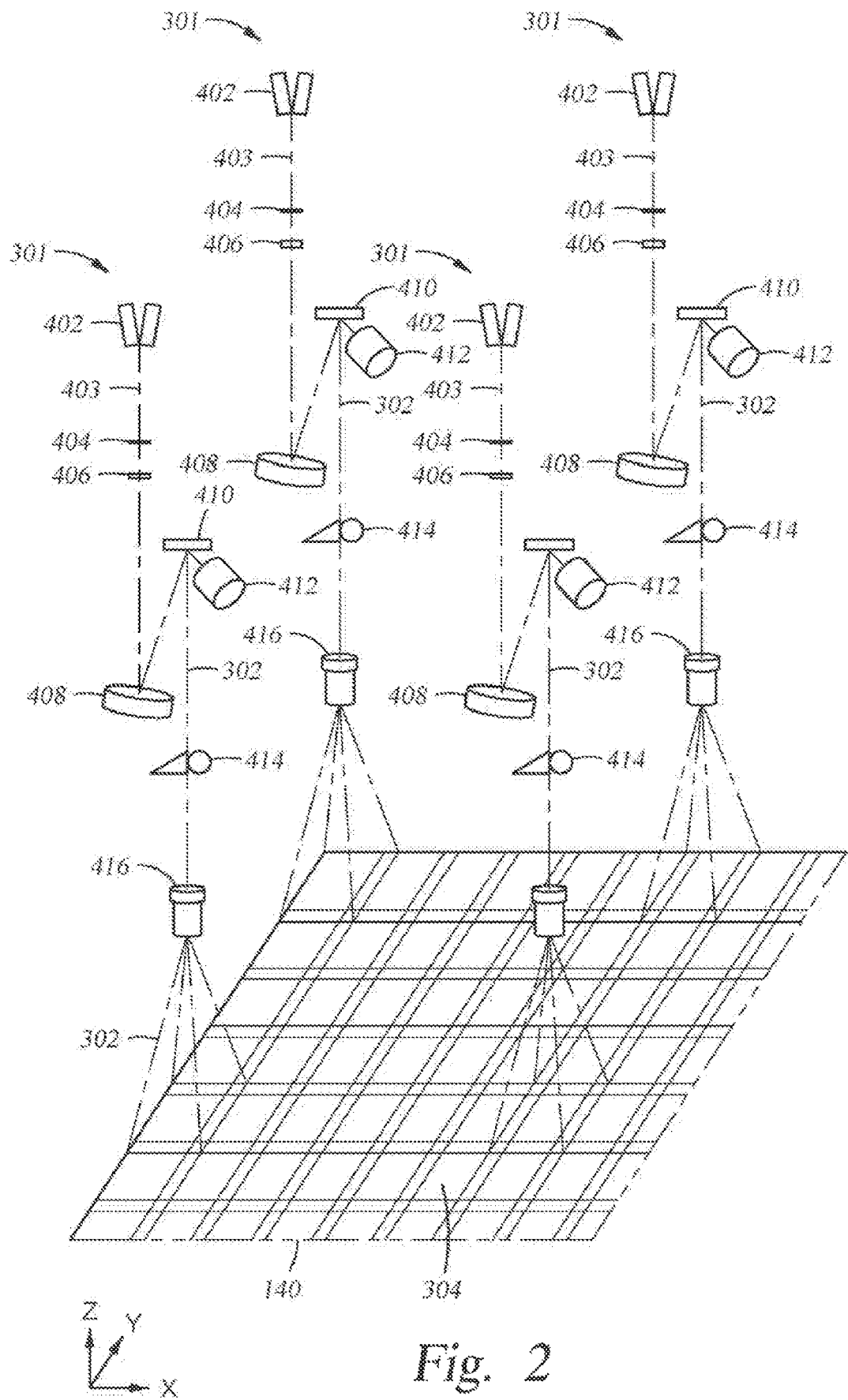
FIG. 2 is a perspective schematic view of a plurality of image projection systems, according to one embodiment.

The processing unit 164 includes a plurality of image projection apparatus (shown in FIG. 2). The image projection apparatus are generally disposed in a grid formed of rows (running in the X-direction) and columns (running in the Y-direction). In some embodiments, the processing unit 164 contains as many as 84 image projection apparatus. Each image projection apparatus is disposed in a case 165. The processing apparatus 160 is useful to perform maskless direct patterning.

During operation, the stage 130 moves in the X-direction from a loading position, as shown in FIG. 1, to a processing position. The processing position is one or more positions of the stage 130 as the stage 130 passes under the processing unit 164. During operation, the stage 130 is lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus 270 can accurately locate the patterns being written in a photoresist covered substrate. The metrology system also provides a real-time measurement of the angular position of each of the stage 130 about the vertical or Z-axis. The angular position measurement can be used to hold the angular position constant during scanning by means of a servo mechanism or it can be used to apply corrections to the positions of the patterns being written on the substrate 140 by the image projection apparatus 270, shown in FIG. 2. These techniques may be used in combination.

FIG. 2 is a perspective schematic view of a plurality of image projection systems 301 according to one embodiment. As shown in FIG. 2, each image projection system 301 produces a plurality of write beams 302 onto a surface 304 of the substrate 140. As the substrate 140 moves in the X-direction and Y-direction, the entire surface 304 may be patterned by the write beams 302. The number of the image projection systems 301 may vary based on the size of the substrate 140 and/or the speed of stage 130. In one embodiment, there are 22 image processing units 164 in the processing apparatus 160.

As further shown in FIG. 2, the image projection system 301 may include a light source 402, an aperture 404, a lens 406, a mirror 408, a DMD 410, a light dump 412, a camera 414, and a projection lens 416. The light source 402 may be a light emitting diode (LED) or a laser, and the light source 402 may be capable of producing a light having predetermined wavelength. In one embodiment, the predetermined wavelength is in the blue or near ultraviolet (UV) range, such as less than about 450 nm. The mirror 408 may be a spherical mirror. The projection lens 416 may be a 10× objective lens. The DMD 410 may include a plurality of mirrors, and the number of mirrors may correspond to the resolution of the projected image. In one embodiment, the DMD 410 includes 1920×1080 mirrors.

During operation, a beam 403 having a predetermined wavelength, such as a wavelength in the blue range, is produced by the light source 402. The beam 403 is reflected to the DMD 410 by the mirror 408. The DMD 410 includes a plurality of mirrors that may be controlled individually, and each mirror of the plurality of mirrors of the DMD 410 may be at "on" position or "off" position, based on the mask data provided to the DMD 410 by the controller (not shown). When the beam 403 reaches the mirrors of the DMD 410, the mirrors that are at "on" position reflect the beam 403, i.e., forming the plurality of write beams 302, to the projection lens 416. The projection lens 416 then projects the write beams 302 to the surface 304 of the substrate 140. The mirrors that are at "off" position reflect the beam 403 to the light dump 412 instead of the surface 304 of the substrate 140.

In one embodiment, the DMD 410 may have two mirrors. Each mirror may be disposed on a tilting mechanism, which may be disposed on a memory cell. The memory cell may be a CMOS SRAM. During operation, each mirror is controlled by loading the mask data into the memory cell. The mask data electrostatically controls the tilting of the mirror in a binary fashion. When the mirror is in a reset mode or without power applied, it may be set to a flat position, not corresponding to any binary number. Zero in binary may correspond to an "off" position, which means the mirror is tilted at −10 degrees, −12 degrees, or any other feasibly negative tilting degree. One in binary may correspond to an "on" position, which means the mirror is tilted at +10 degrees, +12 degrees, or any other feasibly positive tilting degree.

Figure 3:
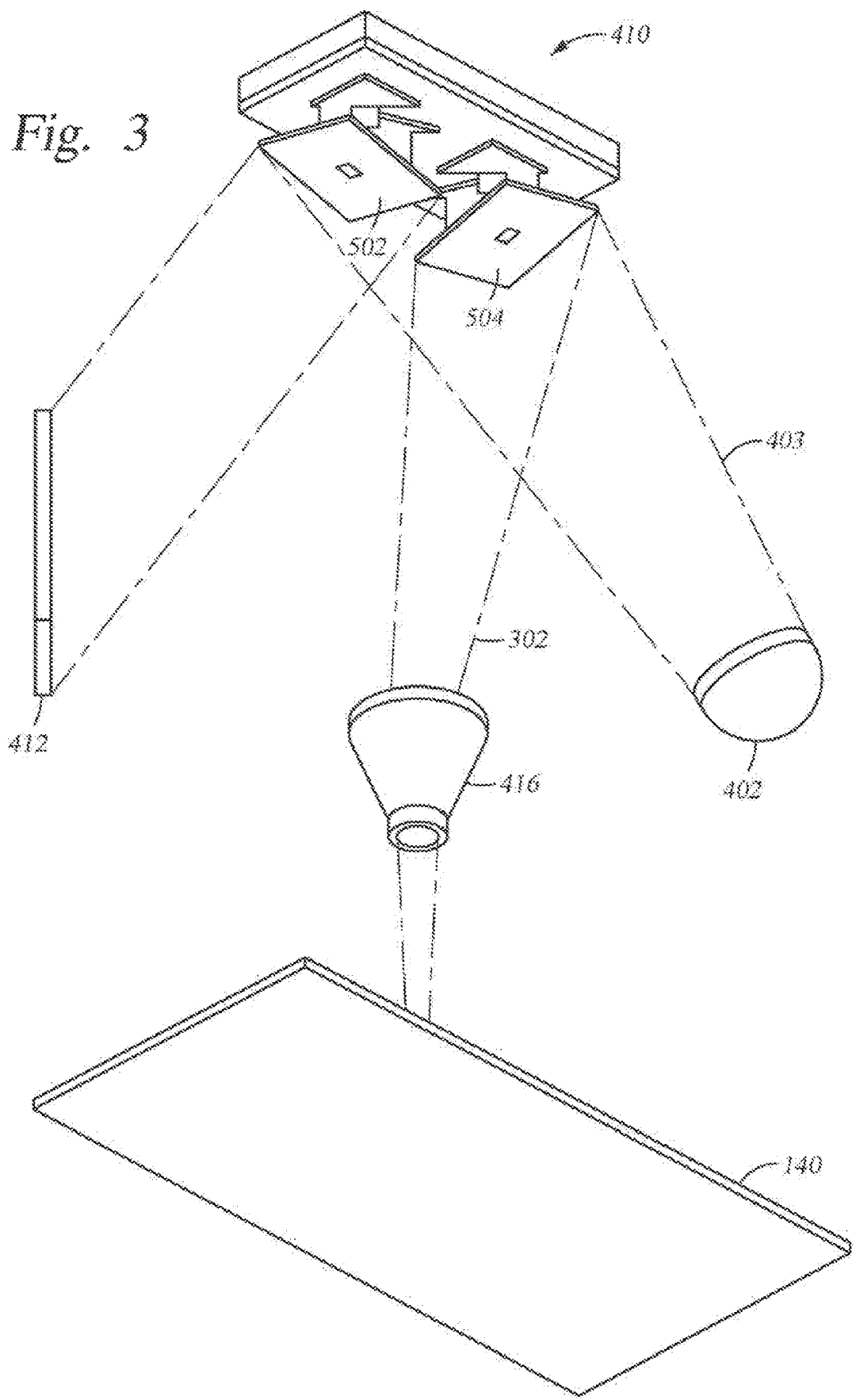
FIG. 3 schematically illustrates a beam being reflected by the two mirrors of the DMD, according to one embodiment.

FIG. 3 schematically illustrates the beam 403 being reflected by two mirrors 502, 504 of the DMD 410. As shown, the mirror 502, which is at "off" position, reflects the beam 403 generated from the light source 402 to the light dump 412. The mirror 504, which is at "on" position, forms the write beam 302 by reflecting the beam 403 to the projection lens 416.

Each system 100 may contain any number of image projection systems 301, and the number of image projection systems 301 may vary by system. In one embodiment there are 84 image projection systems 301. Each image projection system 301 may comprise 40 diodes, or any number of diodes.

Figure 4:
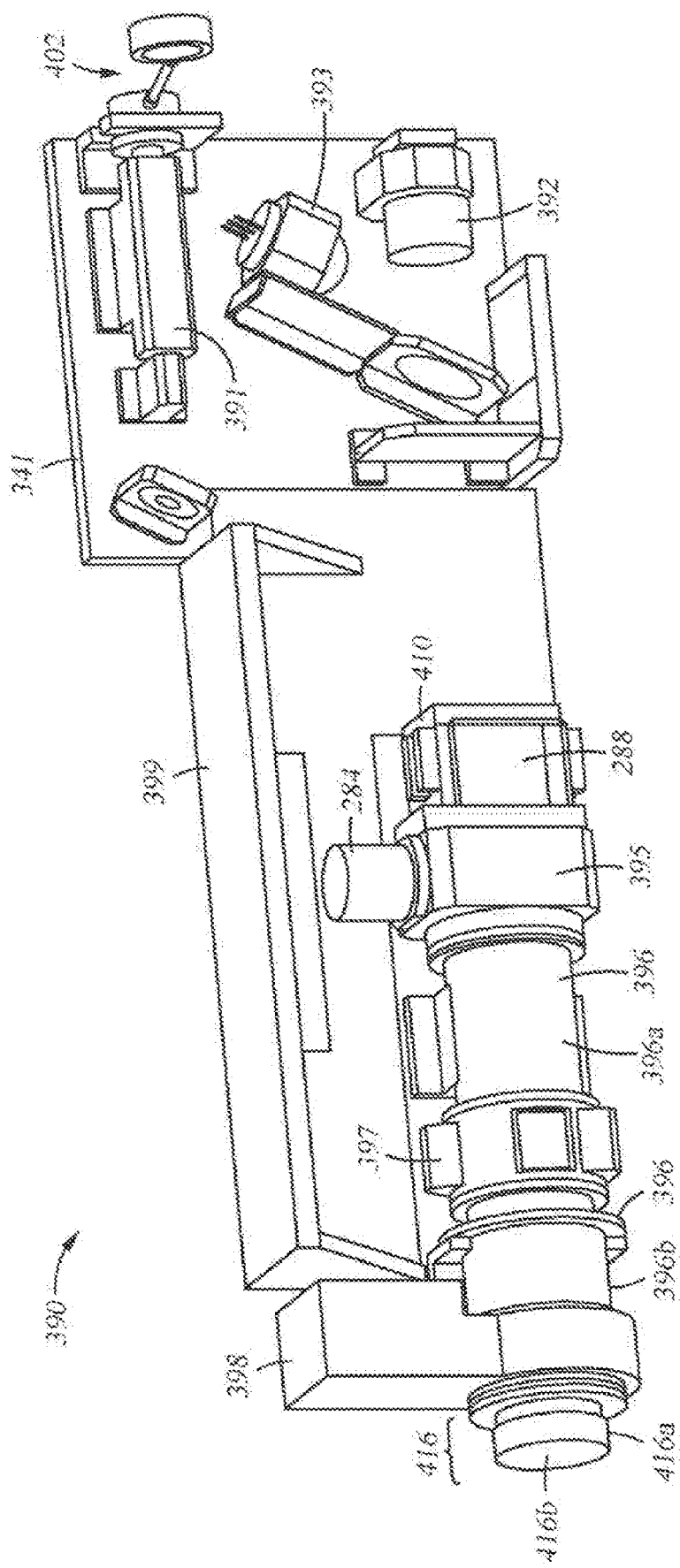
FIG. 4 is a perspective view of an image projection apparatus, according to one embodiment.

FIG. 4 is a perspective view of an image projection apparatus 390 according to one embodiment. The image projection apparatus 390 is used to focus light to a certain spot on a vertical plane of a substrate 140 and to ultimately project an image onto that substrate 140. The image projection apparatus 390 includes two subsystems. The image projection apparatus 390 includes an illumination system and a projection system. The illumination system includes at least a light pipe 391 and a white light illumination device 392. The projection system includes at least a DMD 410, a frustrated prism assembly 288, a beamsplitter 395, one or more projection optics 396 a, 396 b, a distortion compensator 397, a focus motor 398 and a projection lens 416 (discussed supra). The projection lens 416 includes a focus group 416a and a window 416b.

Light is introduced to the image projection apparatus 390 from the light source 402. The light source 402 may be an actinic light source. For example, the light source 402 may be a bundle of fibers, each fiber containing one laser. In one embodiment, the light source 402 may be a bundle of about 100 fibers. The bundle of fibers may be illuminated by laser diodes. The light source 402 is coupled to the light pipe (or kaleido) 391. In one embodiment, the light source 402 is coupled to the light pipe 391 through a combiner, which combines each of the fibers of the bundle.

Once light from the light source 402 enters into the light pipe 391, the light bounces around inside the light pipe 391 such that the light is homogenized and uniform when it exits the light pipe 391. The light may bounce in the light pipe 391 up to six or seven times. In other words, the light goes through six to seven total internal reflections within the light pipe 391, which results in the output of uniform light.

The image projection apparatus 390 may optionally include various reflective surfaces (not labeled). The various reflective surfaces capture some of the light traveling through the image projection apparatus 390. In one embodiment, the various reflective surfaces may capture some light and then help direct the light to a light level sensor 393 so that the laser level may be monitored.

The white light illumination device 392 projects broadband visible light, which has been homogenized by the light pipe 391, into the projection system of image projection apparatus 390. Specifically, the white light illumination device 392 directs the light to the frustrated prism assembly. The actinic and broad-band light sources may be turned on and off independently of one another.

The frustrated prism assembly 288 functions to filter the light that will be projected onto the surface of the substrate 140. The light beam is separated into light that will be projected onto the substrate 140 and light that will not. Use of the frustrated prism assembly 288 results in minimum energy loss because the total internal reflected light goes out. The frustrated prism assembly 288 is coupled to a beamsplitter 395.

A DMD 410 is included as part of the frustrated cube assembly. The DMD 410 is the imaging device of the image projection apparatus 390. Use of the DMD 410 and frustrated prism assembly 288 help to minimize the footprint of each image projection apparatus 390 by keeping the direction of the flow of illumination roughly normal to the substrate 140 all the way from the light source 402 that generates the exposure illumination to the substrate focal plane.

The beamsplitter 395 is used to further extract light for alignment. More specifically, the beamsplitter 395 is used to split the light into two or more separate beams. The beamsplitter 395 is coupled to the one or more projection optics 396. Two projection optics 396 a, 396 b are shown in FIG. 4.

In one embodiment, a focus sensor and camera 284 is attached to the beamsplitter 395. The focus sensor and camera 284 may be configured to monitor various aspects of the imaging quality of the image projection apparatus 390, including, but not limited to, through lens focus and alignment, as well as mirror tilt angle variation. Additionally, the focus sensor and camera 284 may show the image, which is going to be projected onto the substrate 140. In further embodiments, the focus sensor and camera 284 may be used to capture images on the substrate 140 and make a comparison between those images. In other words, the focus sensor and camera 284 may be used to perform inspection functions.

Together the projection optics 396, the distortion compensator 397, the focus motor 398, and the projection lens 416 prepare for and ultimately project the image from the DMD 410 onto the substrate 140. Projection optics 396 a is coupled to the distortion compensator 397. The distortion compensator 397 is coupled to projection optics 396 b, which is coupled to the focus motor 398. The focus motor 398 is coupled to the projection lens 416. The projection lens 416 includes a focus group 416a and a window 416b. The focus group 416a is coupled to the window 416b. The window 416b may be replaceable.

The light pipe 391 and white light illumination device 392 are coupled to a first mounting plate 341. Additionally, in embodiments including additional various reflective surfaces (not labeled) and a light level sensor 393, the various reflective surfaces and the light level sensor 393 may also be coupled to the first mounting plate 341.

The frustrated prism assembly 288, beamsplitter 395, one or more projection optics 396a, 396 b and distortion compensator 397 are coupled to a second mounting plate 399. The first mounting plate 341 and the second mounting plate 399 are planar, which allows for precise alignment of the aforementioned components of the image projection apparatus 390. In other words, light travels through the image projection apparatus 390 along a single optical axis. This precise alignment along a single optical axis results in an apparatus that is compact. For example, the image projection apparatus 390 may have a thickness of between about 80 mm and about 100 mm.

In some embodiments, other hardware such as a microlens or a liquid crystal may be utilized instead of or in combination with the DMD 410 to control the light in an array fashion.

Figure 5:
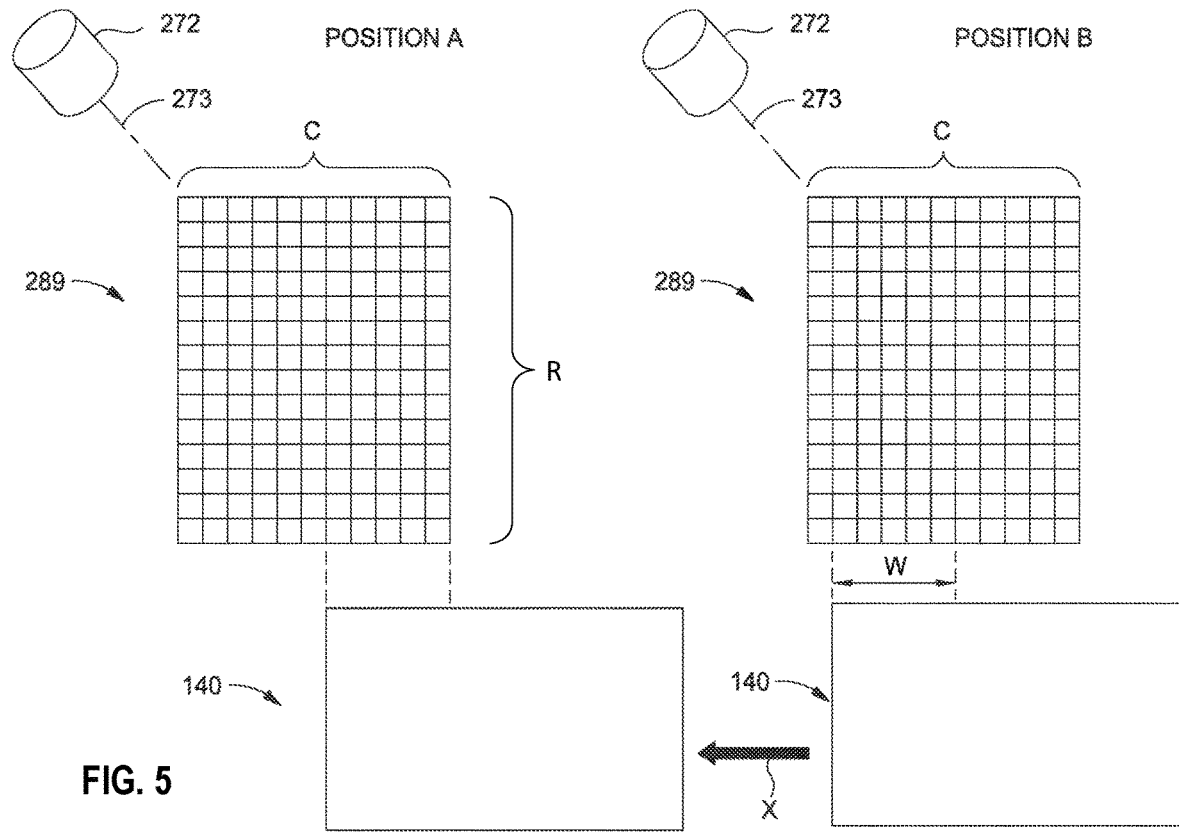
FIG. 5 is a schematic view at a digital micromirror device according to one embodiment.

FIG. 5 is a schematic view of a substrate 140 traveling relative to a DMD 410. The mirrors of the DMD 410 are arranged in rows and columns. The total number of columns of mirrors of the DMD 410 is represented by the letter C. The total number of rows of mirrors of the DMD 410 is represented by the letter R. The substrate 140 moves at a certain velocity relative to the DMD 410. While the embodiment shown depicts movement across only the columns of the DMD 410, the substrate 140 may travel relative to the DMD 410 in any direction. The light beam 273 flashes from light source 272 at a regular interval, As shown in FIG. 5, the substrate 140 moves at a rate such that between flashes of the light beam 273, the substrate 140 travels a distance within the X direction relative to the DMD 410. The distance W corresponds to a number of columns Q of mirrors of the DMD 410. The total number of exposures taken as the DMD 410 scans the entire substrate 140 one time is represented by the letter T. The total number of columns C of mirrors of the DMD 410 divided by the total number of exposures T taken during a single scan equals the number of columns Q traveled by the DMD 410 during a single interval.

Figure 6:
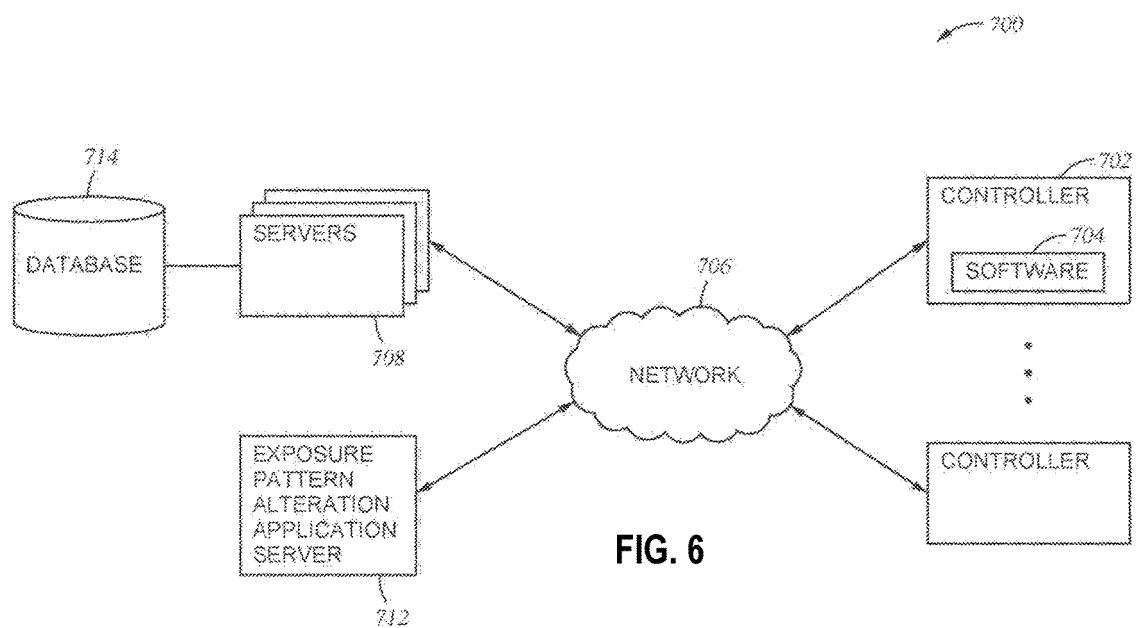
FIG. 6 illustrates a computer system for providing an exposure pattern alteration application for creating serration alterations for exposure patterns to reduce edge placement errors of the exposure patterns during maskless lithography, according to one embodiment.

FIG. 6 illustrates a computing system 700 configured to provide an exposure pattern alteration software application platform in which embodiments of the disclosure may be practiced. As shown, the computing system 700 may include a plurality of servers 708, an exposure pattern alteration application server 712, and a plurality of controllers (i.e., computers, personal computers, mobile/wireless devices) 702 (only two of which are shown for clarity), each connected to a communications network 706 (for example, the Internet). The servers 708 may communicate with the database 714 via a local connection (for example, a Storage Area Network (SAN) or Network Attached Storage (NAS)) or over the Internet. The servers 708 are configured to either directly access data included in the database 714 or to interface with a database manager that is configured to manage data included within the database 714.

Each controller 702 may include conventional components of a computing device, for example, a processor, system memory, a hard disk drive, a battery, input devices such as a mouse and a keyboard, and/or output devices such as a monitor or graphical user interface, and/or a combination input/output device such as a touchscreen which not only receives input but also displays output. Each server 708 and the exposure pattern alteration application server 712 may include a processor and a system memory (not shown) and may be configured to manage content stored in database 714 using, for example, relational database software and/or a file system. The servers 708 may be programmed to communicate with one another, the controllers 702, and the exposure pattern alteration application server 712 using a network protocol such as, for example, the TCP/IP protocol. The exposure pattern alteration application server 712 may communicate directly with the controllers 702 through the communications network 706. The controllers 702 are programmed to execute software 704, such as programs and/or other software applications, and access applications managed by servers 708.

In the embodiments described below, users may respectively operate the controllers 702 that may be connected to the servers 708 over the communications network 706. Pages, images, data, documents, and the like may be displayed to a user via the controllers 702. Information and images may be displayed through a display device and/or a graphical user interface in communication with the controller 702.

It is noted that the controller 702 may be a personal computer, laptop mobile computing device, smart phone, video game console, home digital media player, network-connected television, set top box, and/or other computing devices having components suitable for communicating with the communications network 706 and/or the necessary applications or software. The controller 702 may also execute other software applications configured to receive content and information from the exposure pattern alteration application server 712.

Figure 7:
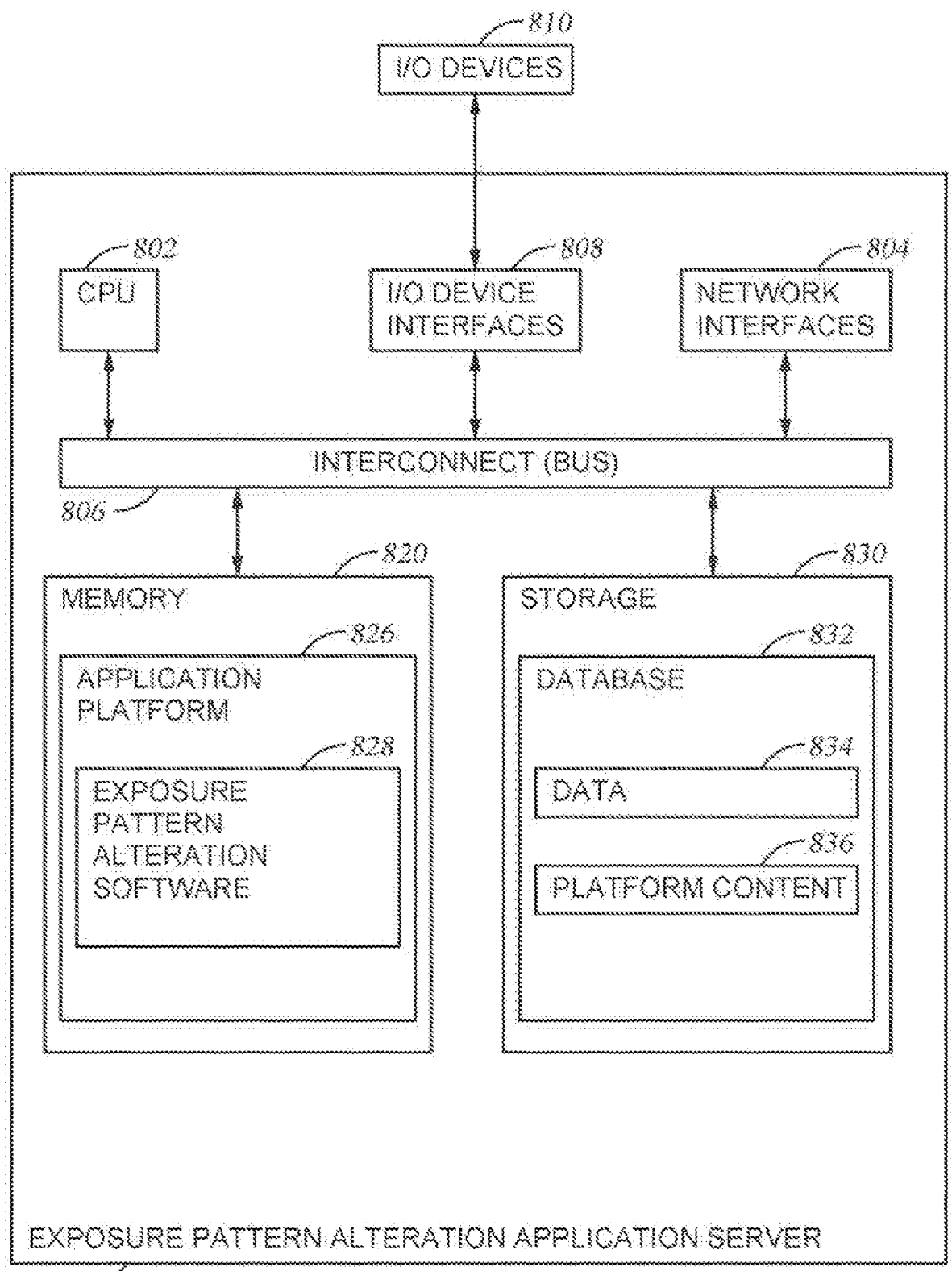
FIG. 7 illustrates a more detailed view of a server of FIG. 5, according to one embodiment.

FIG. 7 illustrates a more detailed view of the exposure pattern alteration application server 712 of FIG. 6. The exposure pattern alteration application server 712 includes, without limitation, a central processing unit (CPU) 802, a network interface 804, memory 820, and storage 830 communicating via an interconnect 806. The exposure pattern alteration application server 712 may also include I/O device interfaces 808 connecting I/O devices 810 (for example, keyboard, video, mouse, audio, touchscreen, etc.). The exposure pattern alteration application server 712 may further include the network interface 804 configured to transmit data via the communications network 706.

The CPU 802 retrieves and executes programming instructions stored in the memory 820 and generally controls and coordinates operations of other system components. Similarly, the CPU 802 stores and retrieves application data residing in the memory 820. The CPU 802 is included to be representative of a single CPU, multiple CPU's, a single CPU having multiple processing cores, and the like. The interconnect 806 is used to transmit programming instructions and application data between the CPU 802, I/O device interfaces 808, storage 830, network interfaces 804, and memory 820.

The memory 820 is generally included to be representative of a random access memory and, in operation, stores software applications and data for use by the CPU 802. Although shown as a single unit, the storage 830 may be a combination of fixed and/or removable storage devices, such as fixed disk drives, floppy disk drives, hard disk drives, flash memory storage drives, tape drives, removable memory cards, CD-ROM, DVD-ROM, Blu-Ray, HD-DVD, optical storage, network attached storage (NAS), cloud storage, or a storage area-network (SAN) configured to store non-volatile data.

The memory 820 may store instructions and logic for executing an application platform 826 which may include exposure pattern alteration software 828. The storage 830 may include a database 832 configured to store data 834 and associated application platform content 836. The database 832 may be any type of storage device.

Network computers are another type of computer system that can be used in conjunction with the disclosures provided herein. Network computers do not usually include a hard disk or other mass storage, and the executable programs are loaded from a network connection into the memory 820 for execution by the CPU 802. A typical computer system will usually include at least a processor, memory, and an interconnect coupling the memory to the processor.

Figure 8:
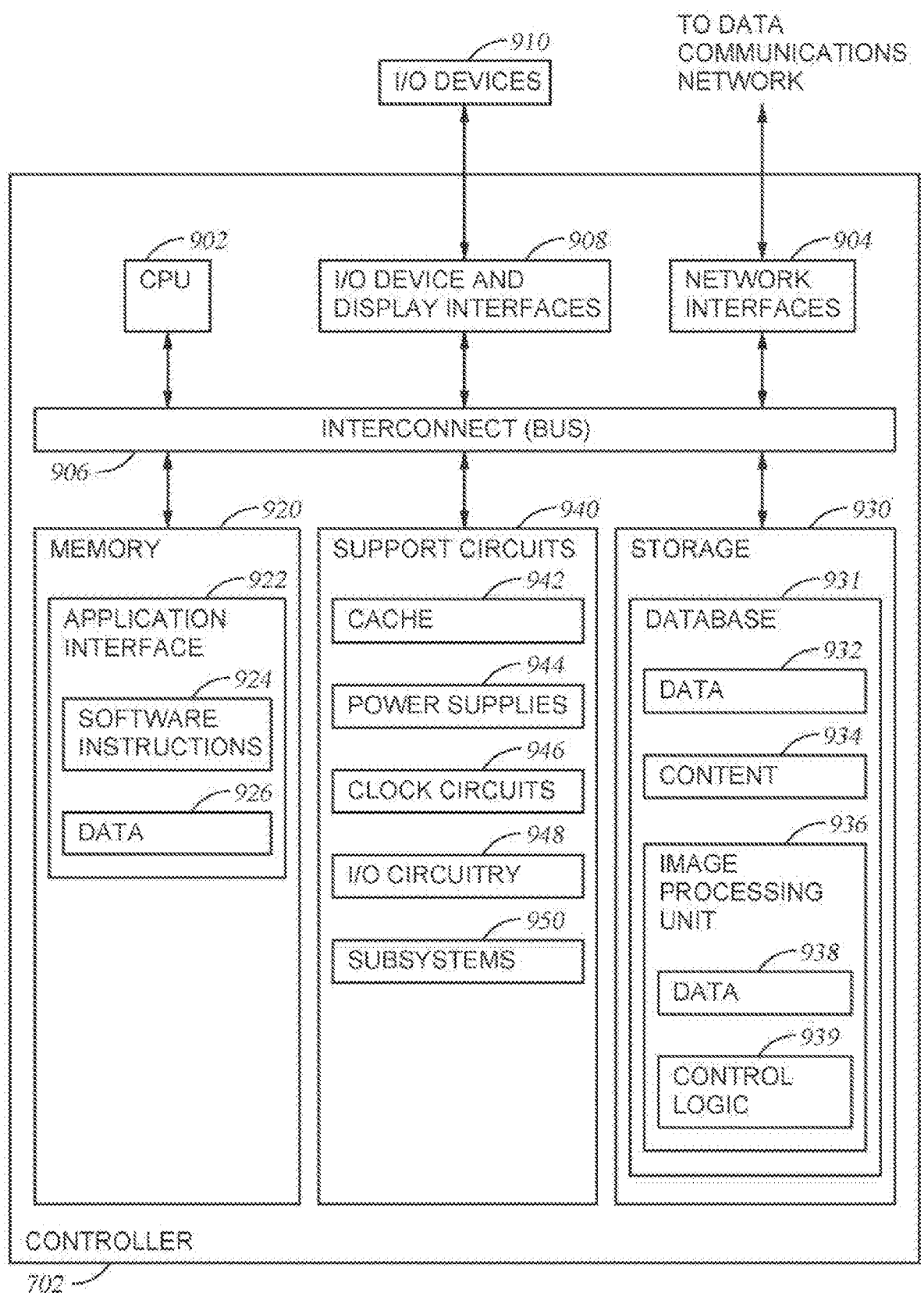
FIG. 8 illustrates a controller computing system used to access an exposure pattern alternation software application for altering the pitch/rotation of exposure patterns to decrease total distortion of the exposure patterns during maskless lithography, according to one embodiment.

FIG. 8 illustrates a controller 702 used to access the exposure pattern alteration application server 712 and retrieve or display data associated with the application platform 826. The controller 702 may include, without limitation, a central processing unit (CPU) 902, a network interface 904, an interconnect 906, a memory 920, storage 930, and support circuits 940. The controller 702 may also include an I/O device interface 908 connecting I/O devices 910 (for example, keyboard, display, touchscreen, and mouse devices) to the controller 702.

Like CPU 802, CPU 902 is included to be representative of a single CPU, multiple CPU's, a single CPU having multiple processing cores, etc., and the memory 920 is generally included to be representative of a random access memory. The interconnect 906 may be used to transmit programming instructions and application data between the CPU 902, I/O device interfaces 908, storage 930, network interface 904, and memory 920. The network interface 904 may be configured to transmit data via the communications network 706, for example, to transfer content from the exposure pattern alteration application server 712. Storage 930, such as a hard disk drive or solid-state storage drive (SSD), may store non-volatile data. The storage 930 may contain a database 931. The database 931 may contain data 932 and other content 934. In some embodiments, the database 931 may further include an image processing unit 936. The image processing unit may include data 938 and/or control logic 939. Illustratively, the memory 920 may include an application interface 922, which itself may display software instructions 924, and/or store or display data 926. The application interface 922 may provide one or more software applications which allow the controller 702 to access data and other content hosted by the exposure pattern alteration application server 712.

The controller 702 may be coupled to or in communication with one or more of the processing apparatus 160, the stages 130, and the encoder 126. The processing apparatus 160 and the stages 130 may provide information to the controller 702 regarding the substrate processing and the substrate aligning. For example, the processing apparatus 160 may provide information to the controller 702 to alert the controller that substrate processing has been completed. The encoder 126 may provide location information to the controller 702, and the location information is then used to control the stages 130 and the processing apparatus 160.

The controller 702 may include a central processing unit (CPU) 902, memory 920, and support circuits 940 (or I/O 908). The CPU 902 may be one of any form of computer processors that are used in industrial settings for controlling various processes and hardware (e.g., pattern generators, motors, and other hardware) and monitor the processes (e.g., processing time and substrate position). The memory 920, as shown in FIG. 8, is connected to the CPU 902, and may be one or more of a readily available memory, such as random access memory (RAM), read only memory (ROM), floppy disk, hard disk, or any other form of digital storage, local or remote. Software instructions and data can be coded and stored within the memory for instructing the CPU 902. The support circuits 940 are also connected to the CPU 902 for supporting the processor in a conventional manner. The support circuits 940 may include conventional cache 942, power supplies 944, clock circuits 946, input/output circuitry 948, subsystems 950, and the like. A program (or computer instructions) readable by the controller 702 determines which tasks are performable on a substrate. The program may be software readable by the controller 702 and may include code to monitor and control, for example, the processing time and substrate position.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present example also relates to an apparatus for performing the operations herein. This apparatus may be specially constructed for the necessary purposes, or it may comprise a general purpose computer selectively activated or reconfigured by a computer program stored in the computer. Such a computer program may be stored in a computer readable storage medium, such as, but is not limited to, read-only memories (ROMs), random access memories (RAMs), EPROMs, EEPROMs, flash memory, magnetic or optical cards, any type of disk including floppy disks, optical disks, CD-ROMs, and magnetic-optical disks, or any type of media suitable for storing electronic instructions, and each coupled to a computer system interconnect.

The algorithms and displays presented herein are not inherently related to any particular computer or other apparatus. Various general purpose systems may be used with programs in accordance with the teachings herein, or it may prove convenient to construct a more specialized apparatus to perform the necessary method operations. The structure for a variety of these systems will appear from the description above. In addition, the present examples are not described with reference to any particular programming language, and various examples may thus be implemented using a variety of programming languages.

As described in greater detail within, embodiments of the disclosure provide a method, computer system, and/or software application through which total pattern distortion may be reduced or minimized for maskless lithography patterning in a manufacturing process.

The exposure pattern provided by a DMD 410 may be distorted. As shown in FIG. 5, a DMD 410 typically comprises mirrors 502, 504 which are spaced at regular intervals to form a grid of rows R and columns C. The spacing between mirrors is referred to as "pitch". The horizontal spacing between columns many be referred to as horizontal pitch, while the spacing between rows may be referred to as vertical pitch. In some embodiments, the horizontal pitch and the vertical pitch are the same. Yet due to optical constraints, the exposure pattern provided by the "on" mirrors 504 does not necessarily provide an exposure pattern spaced at regular intervals.

FIG. 9 illustrates an exemplary actual exposure pattern 1020, shown as O, as compared to the expected exposure pattern 1010, shown as X, based on the horizontal and vertical pitch of the DMD 410. The distortion 1050 of a shot from a respective mirror is shown as a vector from the expected exposure pattern 1010 to the actual exposure pattern 1020.

The distortion 1050 of the shot from any specific mirror shot is not predictable. Yet, in some instances, the inventors have surprisingly found that the distortion is able to accounted for by adjusting every shot similarly. While the distortion of each shot can be measured, storing an x-adjustment and y-adjustment for each shot is resource intensive in terms of computation, storage and application of these values. The inventors have surprisingly found that computing, storing and applying the same horizontal pitch, vertical pitch and/or rotation adjustment for each shot is far less resource intensive.

In some embodiments, the inventors have found that the distortion in the X-direction increases based on the distance of the shot from the center of the pattern. In some embodiments, the inventors have found that the distortion in the Y-direction increases based on the distance of the shot from the center of the pattern. In some embodiments, the inventors have found that the distortion exhibits a rotational pattern with increasing distortion based on the distance of the shot from the center of the pattern.

Accordingly, the inventors have advantageously found that by altering the programmed pitch (horizontal, vertical or both) between mirrors and/or programming a rotational deviation without altering the physical location of mirrors, it is possible to reduce the amount of total distortion. Stated differently, the methods of this disclosure alter the expected exposure pattern by altering the programmed pitch/rotation. This altered expected exposure pattern has surprisingly less distortion.

Figure 10:
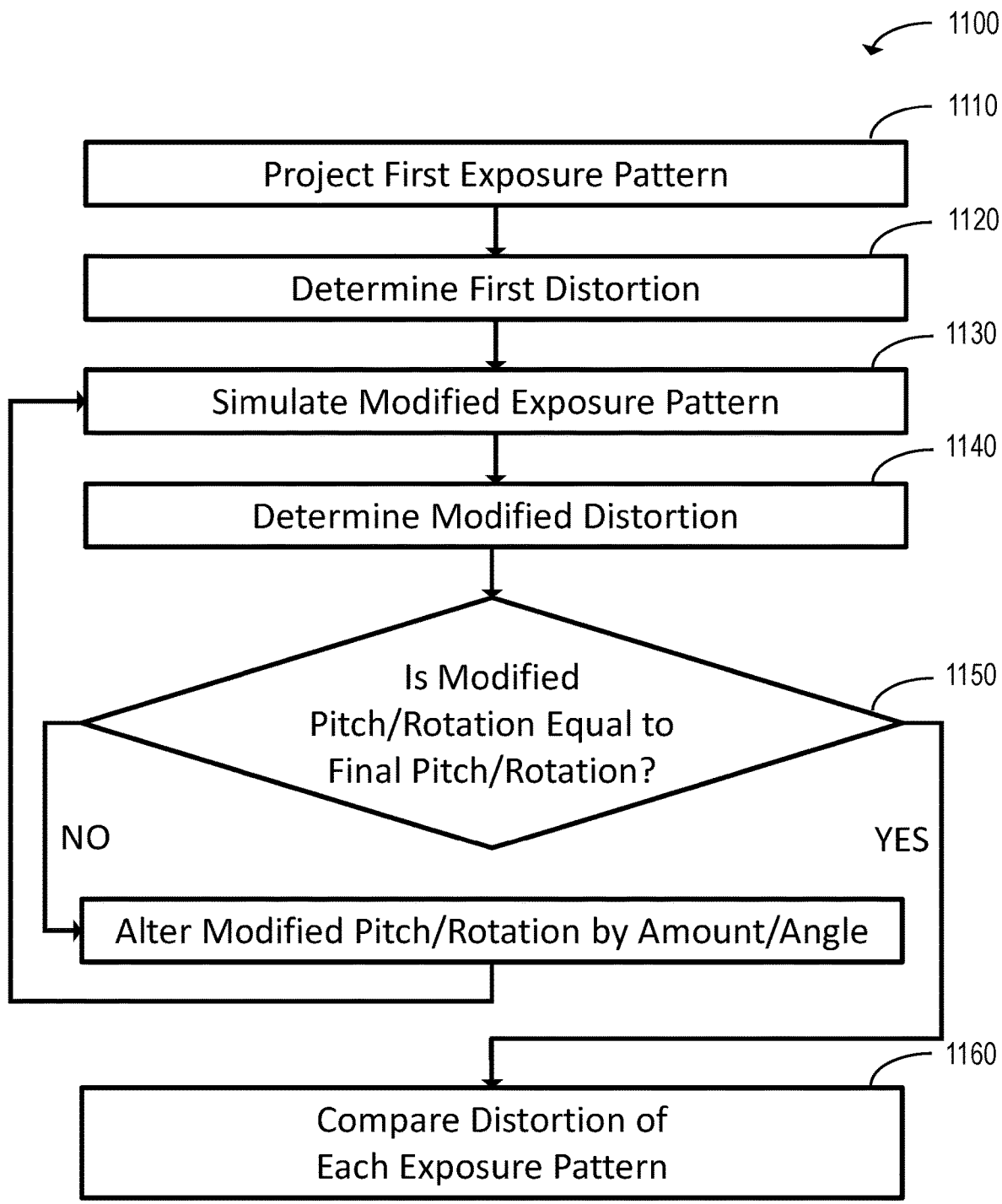
FIG. 10 is a flow chart of a method of decreasing total distortion according to one embodiment.

Referring to FIG. 10, a method 1100 for decreasing or minimizing distortion is described. The method 1100 begins at operation 1110 by projecting a first exposure pattern programmed with a first pitch and a first rotation. In describing the method 1100 reference to a pitch or altering a pitch refers to the pitch programmed into the exposure pattern alteration application server 712 as described above. Further, references to "pitch" may refer to the horizontal pitch and/or the vertical pitch. For the avoidance of doubt, method 1100 does not include physically altering the pitch between mirrors 502, 504 of the DMD 410. In some embodiments, the first pitch is the native pitch of the DMD 410. In some embodiments, the native horizontal pitch of the DMD 410 is about 1.52 microns.

Further, in describing the method 1100 reference to a rotation or altering a rotation refers to programming into the exposure pattern alteration application server 712 a rotation of the entire exposure pattern around a center point. In this way, the method 1100 may alter an exposure pattern by rotation the entire exposure pattern. References to "rotation" should be understood to include both negative and positive rotation. In some embodiments, the first rotation is the rotation of the exposure pattern without any modification. For the purposes of "positive" and "negative" rotation, the rotation of the exposure pattern without any modification may be considered 0°.

After projecting the first exposure pattern at 1110, the total distortion of the first exposure pattern is determined at operation 1120. The total distortion of an exposure pattern is the sum of the magnitude of distortion for each shot of the exposure pattern.

In some embodiments, the total distortion of the first exposure pattern may be measured by projecting the first exposure pattern at a camera. In some embodiments, the camera is configured to measure the distortion of each shot. In some embodiments, the camera measures a representative sampling or subset of the total exposure pattern.

In some embodiments, the distortion for each shot is only determined in a direction directly between adjacent shots. Stated differently, in some embodiments, the distortion is the sum of only the distortion in the X direction or the Y direction. In some embodiments, the magnitude of distortion for each shot is only the distortion in in the direction between adjacent columns (i.e., the X direction).

Next, at operations 1130 and 1140, a modified exposure pattern with a modified pitch/rotation is simulated and the total distortion of the modified exposure pattern is determined. The modified exposure pattern has a modified pitch/rotation which differs from the first pitch by an amount or the first rotation by an angle. All other parameters between the first exposure pattern and the second exposure pattern are the same except for the pitch/rotation.

At operation 1130, the modified exposure pattern is simulated based on the first exposure pattern. Provided the expected exposure pattern 1010 (X in FIG. 9) and the actual exposure pattern 1020 (O in FIG. 9), it is possible to simulate modifications in the horizontal pitch, vertical pitch and/or rotation of the expected exposure pattern. This modified exposure pattern can be used in operation 1140.

At operation 1140, the total distortion of the modified exposure pattern is determined by the same method used to determine the total distortion of the first exposure pattern.

As stated previously, the modified pitch/rotation differs from the first pitch by a predetermined amount or the first rotation by a predetermined angle. In some embodiments, the amount is in a range of 1E-6 micron to 1E-4 micron. In some embodiments, the angle is in a range of 0.1 μrad to 10 μrad.

At operation 1150, a determination is made as to whether the modified pitch/rotation is equal to a predetermined final pitch or predetermined final rotation. If the modified pitch/rotation is not equal to the final pitch/rotation, the method 1100 alters the modified pitch by the amount or the modified rotation by the angle and returns to operation 1130 with a new modified pitch/rotation. In this way, method 1100 measures the total distortion across a range of pitch/rotation values, beginning at the first pitch/rotation and ending at the final pitch/rotation, with intermediate values separated by the amount/angle. In some embodiments, the difference between the first pitch and the final pitch is in a range of 0.1 nm to 10 nm, in a range of 0.1 nm to 1 nm, in a range of 1 nm to 10 nm, or equal to about 1 nm. In some embodiments, the difference between the first rotation and the final rotation is in a range of 0.5 rad to 5 rad, or equal to about 2 rad.

If the modified pitch/rotation is equal to the final pitch/rotation, the method 1100 moves to operation 1160 where the total distortion for each exposure pattern of differing pitch/rotation is compared. In some embodiments, the total distortions are compared by plotting the pitch/rotation of each exposure pattern against the total distortion of each exposure pattern. In some embodiments, a table of total distortions for each exposure pattern is assembled. Regardless of the method of comparing total distortion, a minimum value for total distortion and the corresponding pitch/rotation may be determined at 1160.

A non-limiting implementation of method 1100 may include determining distortion across a range of horizontal pitch values at a set vertical pitch and set rotation, modifying the vertical pitch, and then determining and comparing total distortion across the same range of horizontal pitch values at the modified vertical pitch. This method may be repeated across a range of vertical pitch values. Further, the determination across the range of horizontal and vertical pitch values may be repeated across a range of rotations. This description is not intended to be limiting as to the selection of variables sampled or the order in which the variables are adjusted.

In this way, it is possible to assemble an array of distortion values across a range of horizontal pitch values, vertical pitch values and/or rotations. The minimum value of the array corresponds to the horizontal pitch, vertical pitch and rotation with the minimum distortion across the sampled ranges.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method for minimizing distortion, the method comprising:
   projecting a first exposure pattern with a first pitch and a first rotation;
   determining a first distortion of the first exposure pattern;
   applying a modified pitch or a modified rotation to the first exposure pattern to simulate a modified exposure pattern, the modified pitch being different than the first pitch by an amount or the modified rotation being different than the first rotation by an angle;
   determining a modified distortion of the modified exposure pattern;
   repeating application of a modified pitch which is altered by the amount or a modified rotation which is altered by the angle to simulate modified exposure patterns and determining the modified distortion until the modified pitch equals a predetermined final pitch or the modified rotation equals a predetermined final rotation; and
   comparing the distortion of each exposure pattern to determine the exposure pattern and corresponding pitch or rotation with the minimum distortion.

2. The method of claim 1, wherein a difference between the first pitch and the predetermined final pitch is in a range of 0.1 nm to 10 nm.

3. The method of claim 1, wherein the amount is in a range of 1E-6 micron to 1E-4 micron.

4. The method of claim 1, wherein a difference between the first rotation and the predetermined final rotation is in a range of 0.5 mrad to 2 mrad.

5. The method of claim 1, wherein the angle is in a range of 0.1 μrad to 10 μrad.

6. The method of claim 1, wherein determining the distortion of the exposure pattern comprises summing the magnitude of distortion for each shot of the exposure pattern.

7. The method of claim 1, wherein the method is repeated to:
(a) determine the distortion across a range of horizontal pitch values given a set vertical pitch and set rotation;
(b) repeating (a) across a range of vertical pitch values and a set rotation; and
(c) repeating (a) and (b) across a range of rotation values, before comparing the distortion of each exposure pattern to determine the exposure pattern and corresponding pitch or rotation with the minimum distortion.

8. A computer system for decreasing optical distortion, the computer system comprising:
a processor; and
a memory storing instructions that, when executed by the processor, cause the computer system to:
project a first exposure pattern with a first pitch and a first rotation;
determine a first distortion of the first exposure pattern;
apply a modified pitch or a modified rotation to the first exposure pattern to simulate a modified exposure pattern, the modified pitch being different than the first pitch by an amount or the modified rotation being different than the first rotation by an angle;
determine a modified distortion of the modified exposure pattern;
repeat application of a modified pitch which is altered by the amount or a modified rotation which is altered by the angle to simulate modified exposure patterns and determining the modified distortion until the modified pitch equals a predetermined final pitch or the modified rotation equals a predetermined final rotation; and
compare the distortion of each exposure pattern to determine the exposure pattern and corresponding pitch or rotation with the minimum distortion.

9. The computer system of claim 8, wherein a difference between the first pitch and the predetermined final pitch is in a range of 0.1 nm to 10 nm.

10. The computer system of claim 8, wherein the amount is in a range of 1E-6 micron to 1E-4 micron.

11. The computer system of claim 8, wherein a difference between the first rotation and the predetermined final rotation is in a range of 0.5 mrad to 2 mrad.

12. The computer system of claim 8, wherein the angle is in a range of 0.1 μrad to 10 μrad.

13. The computer system of claim 8, wherein determining the distortion of the exposure pattern comprises summing the magnitude of distortion for each shot of the exposure pattern.

14. The computer system of claim 8, wherein the instructions are repeated to:
(a) determine the distortion across a range of horizontal pitch values given a set vertical pitch and set rotation;
(b) repeating (a) across a range of vertical pitch values and a set rotation; and
(c) repeating (a) and (b) across a range of rotation values, before comparing the distortion of each exposure pattern to determine the exposure pattern and corresponding pitch or rotation with the minimum distortion.

15. A non-transitory computer readable medium storing instructions that, when executed by a processor, cause a computer system to decrease total distortion, by:
projecting a first exposure pattern with a first pitch and a first rotation;
determining a first distortion of the first exposure pattern;
applying a modified pitch or a modified rotation to the first exposure pattern to simulate a modified exposure pattern, the modified pitch being different than the first pitch by an amount or the modified rotation being different than the first rotation by an angle;
determining a modified distortion of the modified exposure pattern;
repeating application of a modified pitch which is altered by the amount or a modified rotation which is altered by the angle to simulate modified exposure patterns and determining the modified distortion until the modified pitch equals a predetermined final pitch or the modified rotation equals a predetermined final rotation; and
comparing the distortion of each exposure pattern to determine the exposure pattern and corresponding pitch or rotation with the minimum distortion.

16. The non-transitory computer readable medium of claim 15, wherein a difference between the first pitch and the predetermined final pitch is in a range of 0.1 nm to 10 nm.

17. The non-transitory computer readable medium of claim 15, wherein the amount is in a range of 1E-6 micron to 1E-4 micron.

18. The non-transitory computer readable medium of claim 15, wherein a difference between the first rotation and the predetermined final rotation is in a range of 0.5 mrad to 2 mrad.

19. The non-transitory computer readable medium of claim 15, wherein the angle is in a range of 0.1 μrad to 10 μrad.

20. The non-transitory computer readable medium of claim 15, wherein the instructions are repeated to:
(a) determine the distortion across a range of horizontal pitch values given a set vertical pitch and set rotation;
(b) repeating (a) across a range of vertical pitch values and a set rotation; and
(c) repeating (a) and (b) across a range of rotation values, before comparing the distortion of each exposure pattern to determine the exposure pattern and corresponding pitch or rotation with the minimum distortion.

* * * * *

UNITED STATES PATENT AND TRADEMARK OFFICE
CERTIFICATE OF CORRECTION

Page 1 of 1

PATENT NO. : 11,822,253 B2
APPLICATION NO. : 17/740960
DATED : November 21, 2023
INVENTOR(S) : Joseph Johnson et al.

It is certified that error appears in the above-identified patent and that said Letters Patent is hereby corrected as shown below:

In the Specification

• Column 4, Line 22, replace "aft" after "Passive" and before "isolators 112" with "air".

Signed and Sealed this
Twentieth Day of February, 2024

Katherine Kelly Vidal
*Director of the United States Patent and Trademark Office*